United States Patent
Addepalli et al.

(10) Patent No.: US 9,406,829 B2
(45) Date of Patent: Aug. 2, 2016

(54) METHOD OF MANUFACTURING A PHOTOVOLTAIC DEVICE

(71) Applicant: First Solar, Inc., Perrysburg, OH (US)

(72) Inventors: Pratima Addepalli, Saline, MI (US); Benyamin Buller, Sylvania, OH (US); Markus Gloeckler, Perrysburg, OH (US); Akhlesh Gupta, Sylvania, OH (US); David Hwang, Perrysburg, OH (US); Andrei Los, Perrysburg, OH (US); Rick Powell, Ann Arbor, MI (US); Rui Shao, Sylvania, OH (US); Gang Xiong, Santa Clara, CA (US); Ming Lun Yu, Fremont, CA (US); San Yu, Perrysburg, OH (US); Zhibo Zhao, Novi, MI (US)

(73) Assignee: First Solar, Inc., Perrysburg, OH (US)

( * ) Notice: Subject to any disclaimer, the term of this patent is extended or adjusted under 35 U.S.C. 154(b) by 0 days.

(21) Appl. No.: 14/317,479

(22) Filed: Jun. 27, 2014

(65) Prior Publication Data
US 2015/0004743 A1    Jan. 1, 2015

Related U.S. Application Data

(60) Provisional application No. 61/840,552, filed on Jun. 28, 2013.

(51) Int. Cl.
   *H01L 21/00*    (2006.01)
   *H01L 31/073*   (2012.01)
   *H01L 31/18*    (2006.01)

(52) U.S. Cl.
   CPC .......... *H01L 31/073* (2013.01); *H01L 31/1828* (2013.01); *H01L 31/1864* (2013.01); *Y02E 10/543* (2013.01); *Y02P 70/521* (2015.11)

(58) Field of Classification Search
   None
   See application file for complete search history.

(56) References Cited

U.S. PATENT DOCUMENTS

| | | | |
|---|---|---|---|
| 7,700,464 B2 | 4/2010 | Robinson et al. | |
| 7,709,728 B2 | 5/2010 | Walukiewicz et al. | |
| 7,858,872 B2 | 12/2010 | Hotz et al. | |
| 8,187,963 B2 | 5/2012 | Basol | |
| 8,188,367 B2 | 5/2012 | Basol | |
| 2002/0179589 A1 | 12/2002 | Morita et al. | |
| 2003/0170971 A1* | 9/2003 | Tomoda | H01L 21/268 438/602 |
| 2004/0253839 A1 | 12/2004 | Shimuzu et al. | |
| 2006/0207644 A1 | 9/2006 | Robinson et al. | |
| 2007/0111367 A1 | 5/2007 | Basol | |
| 2007/0163643 A1 | 7/2007 | Van Duren et al. | |
| 2008/0121277 A1 | 5/2008 | Robinson et al. | |

(Continued)

FOREIGN PATENT DOCUMENTS

WO   2011109904 A1   9/2011

OTHER PUBLICATIONS

Xavier Mathew et al., "CdTe/CdS Solar Cells on Flexible Substrates," Solar Energy, 2004, vol. 77, pp. 831-838.

*Primary Examiner* — Calvin Choi
(74) *Attorney, Agent, or Firm* — Fraser Clemens Martin & Miller LLC; Michael E. Dockins

(57) ABSTRACT

A method to improve operation of a CdTe-based photovoltaic device is disclosed, the method comprising the steps of depositing a semiconductor absorber layer adjacent to a substrate, depositing a semiconductor buffer layer adjacent to the semiconductor layer, and annealing at least one of the semiconductor absorber layer and the semiconductor buffer layer with one of a laser and a flash lamp.

27 Claims, 4 Drawing Sheets

(56) References Cited

U.S. PATENT DOCUMENTS

| | | |
|---|---|---|
| 2010/0248419 A1 | 9/2010 | Woodruff et al. |
| 2011/0005594 A1 | 1/2011 | Powell et al. |
| 2011/0011340 A1 | 1/2011 | Basol |
| 2011/0030768 A1 | 2/2011 | Fujdala et al. |
| 2011/0081487 A1 | 4/2011 | Bollman et al. |
| 2011/0139247 A1 | 6/2011 | Feldman-Peabody et al. |
| 2011/0143493 A1 | 6/2011 | Feldman-Peabody et al. |
| 2011/0284078 A1 | 11/2011 | Basol |
| 2011/0315220 A1 | 12/2011 | Korevaar et al. |
| 2012/0168910 A1 | 7/2012 | Jackrel et al. |
| 2012/0192948 A1 | 8/2012 | Basol |
| 2012/0193349 A1 | 8/2012 | Callahan |
| 2013/0065355 A1* | 3/2013 | Liang et al. .............. 438/95 |
| 2013/0068301 A1* | 3/2013 | Wang et al. .............. 136/258 |
| 2013/0104985 A1* | 5/2013 | Korevaar et al. .............. 136/260 |
| 2013/0174895 A1* | 7/2013 | Compaan et al. .............. 136/255 |

* cited by examiner

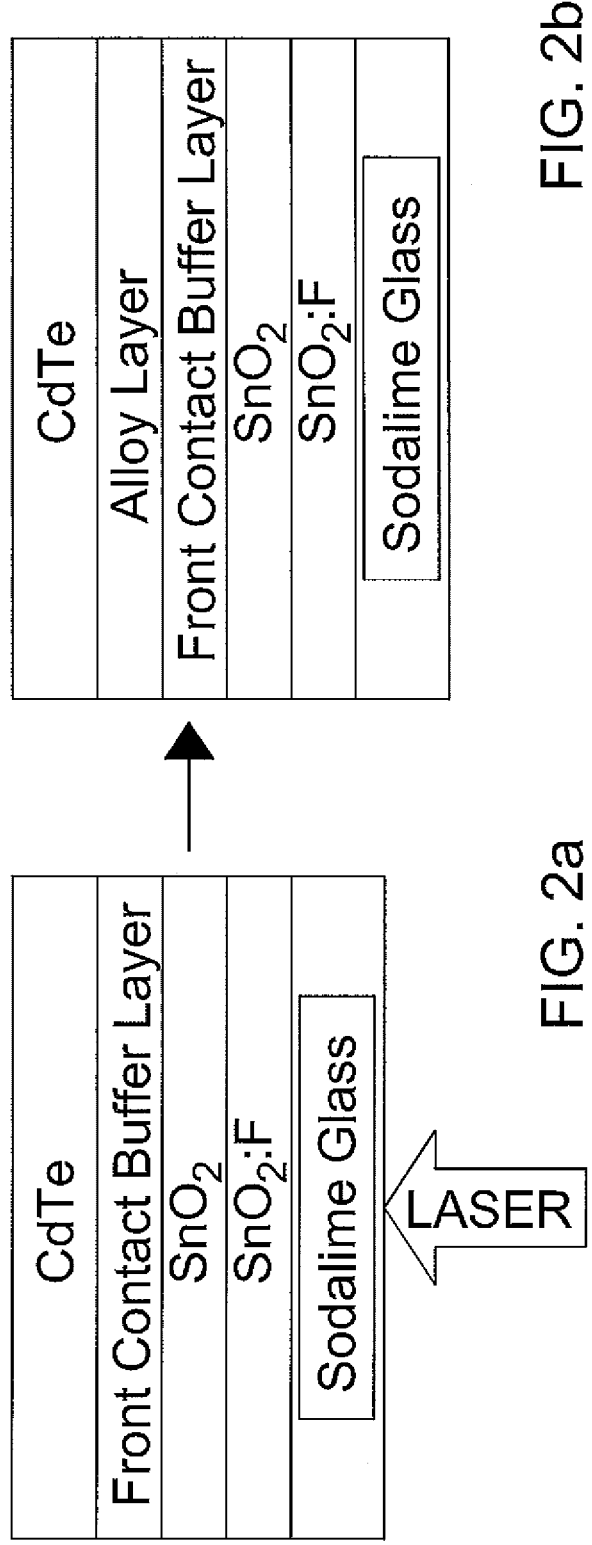

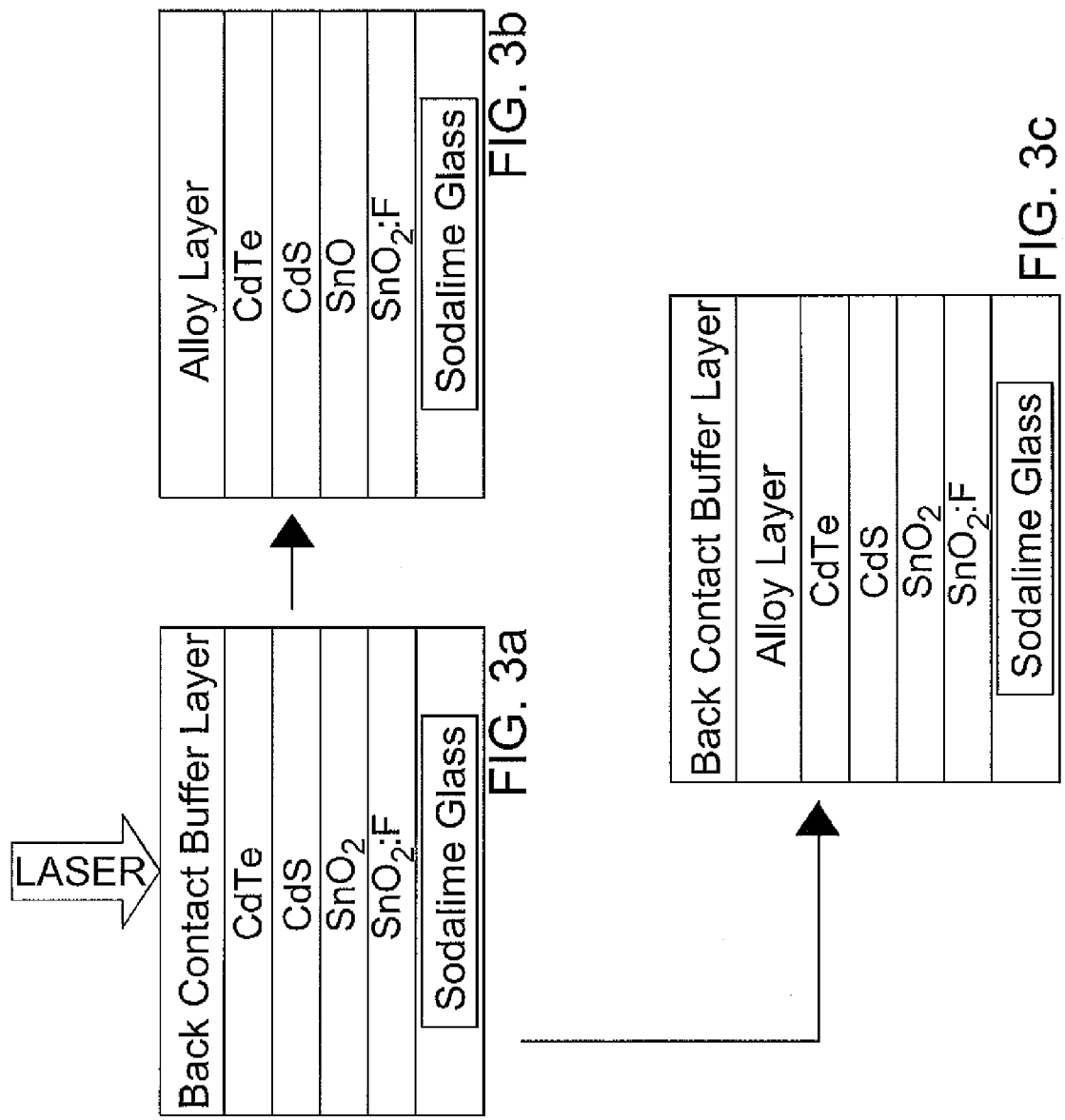

METHOD OF MANUFACTURING A PHOTOVOLTAIC DEVICE

CROSS-REFERENCE TO RELATED APPLICATION

This application claims the benefit of priority of U.S. Provisional Patent Application Ser. No. 61/840,552 filed on Jun. 28, 2013 hereby incorporated herein by reference in its entirety.

FIELD OF THE INVENTION

The present disclosure relates to a photovoltaic device, and more particularly to a method of forming a photovoltaic device to improve performance thereof.

BACKGROUND OF THE INVENTION

During the fabrication of photovoltaic devices, layers of semiconductor material can be applied to a substrate with one layer serving as a window layer and a second layer serving as an absorber layer. In addition to the semiconductor layer (the window and absorber layers), photovoltaic modules, devices, or cells, can include multiple layers (or coatings) created on a substrate (or superstrate). For example, a photovoltaic device can include a barrier layer, a transparent conductive oxide layer, a buffer layer, and a semiconductor layer formed in a stack on a substrate. Each layer may in turn include more than one layer or film. For example, a semiconductor window layer and a semiconductor absorber layer together can be considered a semiconductor layer. Additionally, each layer can cover all or a portion of the device and/or all or a portion of a layer or a substrate underlying the layer. For example, a "layer" can include any amount of any material that contacts all or a portion of a surface. Cadmium telluride has been used for the semiconductor layer because of its optimal band structure and a low cost of manufacturing.

In the manufacture of a photovoltaic device, the absorber layer is deposited on a substrate. This may be accomplished by vaporizing the semiconductor and directing the vaporized semiconductor towards the substrate surface such that the vaporized semiconductor condenses and is deposited on the substrate, forming a solid semiconductor film. The method by which the absorber layer is deposited or formed on the substrate may have an effect on the performance of the photovoltaic device. Improving the characteristics of the absorber layer may improve efficiency thereof, and therefore the efficiency of the photovoltaic device. Furthermore, it is desirable to improve a band alignment at the interface of the absorber layer and adjacent layers to improve the efficiency of the photovoltaic device.

One way to improve the efficiency of an absorber layer is to alloy materials deposited as the absorber layer and/or to alloy the absorber layer and the back contact buffer layer at an interface thereof. Using vapor transport deposition (VTD) or close-spaced sublimation (CSS), improvement to an absorber layer by forming an alloy may be accomplished. However, the compounds used to form the absorber layer may have vastly different vapor pressures that lead to composition variation over time. For example, composition variations may occur due to faster sublimation of one of the compounds, a difference between atomic weights of the compounds, and the annealing temperatures used by known processing equipment may not be sufficiently high to vaporize certain compounds. Furthermore, at VTD and CSS process temperatures, some compounds have solubility gaps which prevent the alloy from forming, and if cooling is not fast enough, precipitation from the alloy may occur.

Alloyed compounds for the absorber layer and/or the back contact or front contact buffer layers may also be generated by coating the substrate within a coating device or by annealing in an oven. The temperatures required to anneal certain compounds to obtain an alloy may exceed 600° C. which may have an undesired effect on a glass substrate. Steps of alloying in the coating device or by annealing in an oven have the same solubility gap and precipitation concerns noted above. Annealing the entire absorber layer at high temperatures, such as in an oven, may also result in sublimation of the compounds forming the absorber layer.

A crystallized back contact buffer layer also improves operation of the photovoltaic device. Depositing the back contact buffer layer at high temperatures to crystallize the back contact buffer layer improves band alignment and photovoltaic device operation. The back contact buffer layer may also be annealed in an annealing oven. However, high temperature deposition of the back contact buffer layer comes and/or using an annealing oven comes at a high capital cost.

It would be desirable to develop a method of improving the operation of a photovoltaic device by improving the interfaces of various layers of a photovoltaic device, for example, by improving a band alignment at the interface of the absorber layer and the back contact buffer layer or annealing the back contact buffer layer using a more efficient method.

SUMMARY OF THE INVENTION

Concordant and congruous with the instant disclosure, a photovoltaic device by improving the interfaces of various layers of a photovoltaic device, for example, by improving a band alignment at the interface of the absorber layer and the back contact buffer layer or annealing the back contact buffer layer using a more efficient method has surprisingly been discovered.

In an embodiment, a method of manufacturing a photovoltaic device comprises the steps of depositing a semiconductor absorber layer adjacent to a substrate; depositing one of a semiconductor back contact buffer layer and a semiconductor front contact buffer layer adjacent to the semiconductor layer; and annealing at least one of the semiconductor absorber layer and the semiconductor back contact buffer layer with one of a laser and a flash lamp.

In another embodiment, a method of manufacturing a photovoltaic device comprises the steps of depositing a semiconductor absorber layer adjacent to a substrate; depositing a back contact buffer layer adjacent to the semiconductor layer; and annealing the semiconductor absorber layer and the back contact buffer layer with one of a laser and a flash lamp to form an alloy of the semiconductor absorber layer and the back contact buffer layer.

In another embodiment, a method of manufacturing a photovoltaic device comprises the steps of depositing a semiconductor absorber layer adjacent to a substrate; depositing a back contact buffer layer adjacent to the semiconductor layer; and annealing the back contact buffer layer with one of a laser and a flash lamp, wherein energy from the one of a laser and a flash lamp penetrates only the back contact buffer layer and does not contact the adjacent semiconductor absorber layer.

DRAWINGS

The above, as well as other advantages of the present disclosure, will become readily apparent to those skilled in the art from the following detailed description, particularly when considered in the light of the drawings described hereafter.

FIG. 2a is a schematic drawing of a photovoltaic device being formed pursuant to an annealing step of the method of FIG. 1 according to an embodiment of the invention;

FIG. 2b is a schematic drawing of the photovoltaic device of FIG. 2a after the annealing step;

FIG. 3a is a schematic drawing of a photovoltaic device being formed pursuant to an annealing step of the method of FIG. 1;

FIG. 3b is a schematic drawing of the photovoltaic device of FIG. 3a after the annealing step according to an embodiment of the invention;

FIG. 3c is a schematic drawing of the photovoltaic device of FIG. 3a after the annealing step according to an embodiment of the invention;

DETAILED DESCRIPTION OF THE INVENTION

Figure 1:
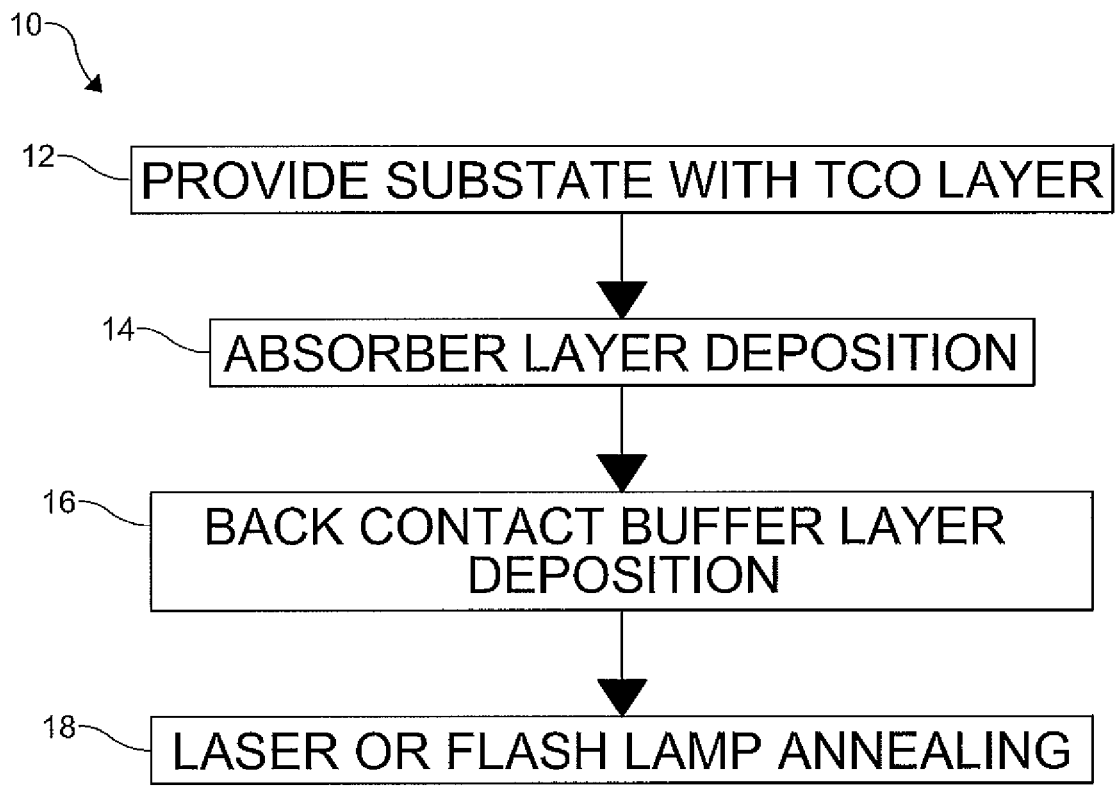
FIG. 1 is a flow diagram of a method of forming a photovoltaic device according to an embodiment of the invention.

The following description is merely exemplary in nature and is not intended to limit the present disclosure, application, or uses. It should also be understood that throughout the drawings, corresponding reference numerals indicate like or corresponding parts and features. In respect of the methods disclosed, the order of the steps presented is exemplary in nature, and thus, is not necessary or critical unless recited otherwise.

FIG. 1 represents a flow diagram of a method 10 of forming a photovoltaic device according to the invention. In a step 12, a substrate having a thin-conductive oxide (TCO) layer deposited thereon is provided. The step 12 may involve providing a sodalime glass and depositing a TCO layer, such as $SnO_2$:F, for example, or any other suitable TCO, as desired. In a step 14, a semiconductor absorber layer is deposited adjacent to the buffer layer. The semiconductor absorber layer is formed from at least a p-type semiconductor such as CdTe, as shown in FIGS. 2-5. The semiconductor absorber layer may include multiple layers and may include an n-type semiconductor absorber layer, such as CdS, as shown in FIGS. 2-5. The semiconductor absorber layer may also be formed from CIGS, amorphous silicon, monocrystalline silicon, GaAs, or another semiconductor material, for example. It is understood that a semiconductor front contact buffer layer (also known as a front contact buffer layer) may be deposited on the TCO prior to deposition of the semiconductor absorber layer, as desired.

In a step 16, a semiconductor back contact buffer layer formed from a metal is deposited adjacent to the semiconductor absorber layer. The back contact buffer layer may be formed from ZnTe, ZnTe:Cu, MnTe, CdSe, MgTe, HgTe, or the like, for example. The back contact buffer layer me be deposited at room (or low) temperature, or at elevated temperatures. A metallic back contact layer (not shown) may be deposited on the back contact buffer layer, and a back support (not shown) may be deposited onto the back contact layer, the back support formed from a glass or a soda-lime glass, for example.

In a step 18, annealing of a desired layer or layers is conducted. The annealing is done with a laser, such as a short pulse laser or a pulse UV laser, for example, or a flash lamp, such as a UV flash lamp, for example. In an embodiment of the invention, the absorber layer is annealed. It is understood that the absorber layer may be annealed prior to the back contact buffer layer deposition step 16 or thereafter. The annealing step 18 of the absorber layer may be conducted by introducing the laser or the flash lamp to a side of the semiconductor layer on which the back contact buffer layer will be deposited, or on an opposite side thereof through the clear substrate of step 12. By annealing the absorber layer through the clear substrate, the annealing step may occur after the photovoltaic device is fully formed and constructed (i.e., the device includes a frame, lead foil, and the like) and prior to packaging and storage or delivery.

The annealing step 18 alloys the layers of the semiconductor absorber layer, or the layers of the semiconductor absorber layer and an adjacent layer, such as a back contact buffer layer, for example. It is understood that the annealing step 18 may result in an alloy being formed between adjacent layers, or one of the layers may be substantially completely replaced by the generated alloy. For example, if the adjacent layers are CdTe and CdS, the annealing step 18 will generate an alloy of $CdS_xTe_{1-x}$. If the adjacent layers are CdTe and ZnTe, the annealing step 18 will generate an alloy of $Cd_{1-x}Zn_xTe$. If the adjacent layers are CdTe and MnTe, the annealing step 18 will generate an alloy of $Cd_{1-x}Mn_xTe$. If the adjacent layers are CdTe and MgTe, the annealing step 18 will generate an alloy of $Cd_{1-x}Mg_xTe$. If the adjacent layers are CdTe and HgTe, the annealing step 18 will generate an alloy of $Cd_{1-x}Hg_xTe$. If the adjacent layers are CdSe and CdTe, the annealing step will generate an alloy of $CdSe_xTe_{1-x}$. It is understood that the alloy layer may be formed between each of the layers being alloyed or near a surface of either of the layers being alloyed, as desired. It is also understood that the alloy layer may completely replace substantially all of one of the layers being alloyed.

The wavelength of the energy from the laser or flash lamp may be chosen so that energy from the laser or flash lamp penetrates only the desired layers to a desired depth (e.g., the semiconductor absorber layer or the semiconductor absorber layer and a back contact buffer layer) so that energy from the laser or flash lamp does not contact other layers of the photovoltaic device. By controlling a depth of penetration of the energy, layers of the photovoltaic device other than the semiconductor absorber layer and/or the back contact buffer layer are not contacted, and any side-effect thereon caused by thermal energy is mitigated. By alloying the semiconductor absorber layers or the semiconductor absorber layer and the semiconductor back contact buffer layer, an interface between the layers is improved due to the formation of an alloy of the adjacent layers. Improving the interface therebetween improves the operation of the photovoltaic device by reducing defect mediated nonradiative loss of photo carriers. Using the method 10, both efficiency and $V_{oc}$ of the photovoltaic device is improved.

Positive results have been obtained performing the step 18 on adjacent layers of a CdTe absorber layer and a CdS front contact buffer layer to generate an alloy layer of $CdS_xTe_{1-x}$ therebetween. The depth of the CdTe may be about 3.3 µm, while the depth of the CdS and $CdS_xTe_{1-x}$ may be altered by either depositing more or less CdS during deposition, as desired, or by altering the power of the laser to generate more or less of the $CdS_xTe_{1-x}$ alloy, as desired. That is, some, all, or substantially all of the front contact buffer layer may be converted to the alloy, as desired. As shown in FIG. 2a, a pulsed diode green laser (about 543 nm) at about 100 kHz frequency and varying power levels is introduced on a sunny side (glass side) of a photovoltaic device to anneal the CdS front contact buffer layer and CdTe absorber layer. As shown in FIG. 2b, the laser causes an alloying of the CdS front contact buffer layer and CdTe layer to generate the alloy layer of $CdS_xTe_{1-x}$ therebetween. By forming the $CdS_xTe_{1-x}$ alloy layer therebetween, the following improvements were observed in the photovoltaic device: a conduction band offset to reduce electron diffusion toward the back contact, thereby improving $V_{oc}$; and creating a narrower band gap resulting in higher absorption of light by the semiconductor absorber layer, especially in the infrared spectrum (e.g., around about 850 nm), thereby leading to a higher current.

As shown in FIGS. 2a and 2b and similar to the alloying of CdS with a laser or flash lamp introduced on the sunny side of a photovoltaic device, positive results have also been obtained performing the step 18 on adjacent layers of a CdTe absorber layer and a CdSe front contact buffer layer to generate an alloy layer of $CdSe_xTe_{1-x}$ therebetween. It is understood that when the front contact layer is CdSe, a back contact layer may be CdSe, CdS, or other suitable material, as desired.

Positive results have also been obtained performing the step 18 on a semiconductor absorber layer of CdTe and a back contact buffer layer formed from one of ZnTe, MnTe, MgTe, HgTe, and CdSe to generate the alloys $Cd_{1-x}Zn_xTe$, $Cd_{1-x}Mn_xTe$, $Cd_{1-x}Mg_xTe$, $Cd_{1-x}Hg_xTe$, and $CdSe_xTe_{1-x}$, respectively. The depth of back contact buffer layer may be from about 5 nm to about 1000 nm. As shown in FIG. 3a, a pulsed diode green laser (about 543 nm) at about 100 kHz frequency and varying power levels is introduced on a sunny side (glass side) of a photovoltaic device to anneal the CdTe and the back contact buffer layer (e.g., ZnTe, MnTe, MgTe, HgTe, or CdSe). As shown in FIGS. 3b and 3c, use of the laser causes an alloying of the CdTe and the back contact buffer layers to generate the alloy layer (e.g., $Cd_{1-x}Zn_xTe$, $Cd_{1-x}Mn_xTe$, $Cd_{1-x}Mg_xTe$, $Cd_{1-x}Hg_xTe$, or $CdSe_xTe_{1-x}$, respectively). FIG. 3b represents the annealing step 18 according to an embodiment whereby substantially all of the material forming the back contact buffer layer is consumed in forming the alloy layer. FIG. 3c represents the annealing step 18 according to an embodiment whereby the alloy layer is formed between the CdTe and the back contact buffer layer. By annealing the semiconductor absorber layer and the back contact buffer layer, performance of the photovoltaic device is improved by creating a conduction band offset to reduce electron diffusion toward the back contact, thereby improving $V_{oc}$ of the photovoltaic device.

Figures 4A, 4B:
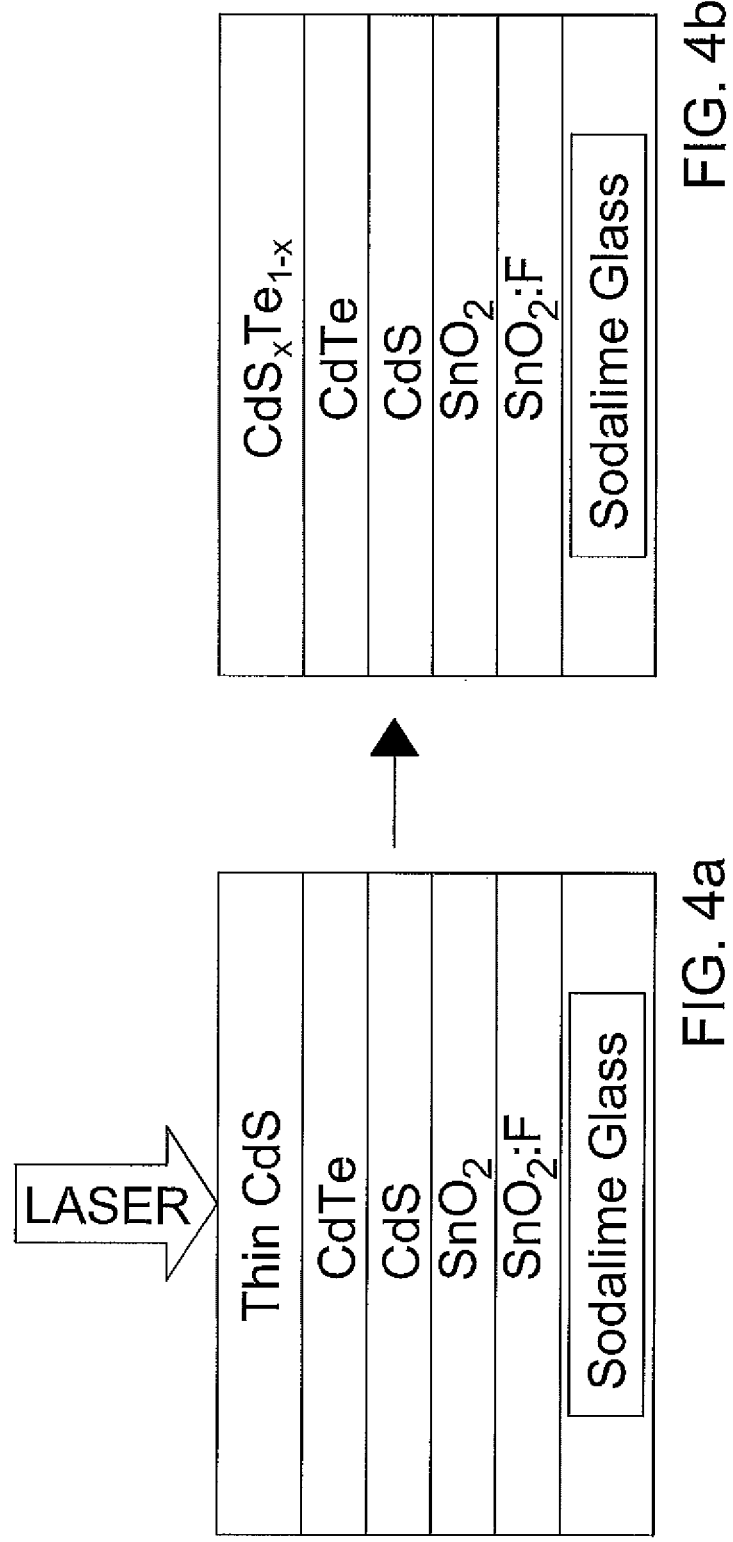
FIG. 4a is a schematic drawing of a photovoltaic device being formed pursuant to an annealing step of the method of FIG. 1 according to another embodiment of the invention.
FIG. 4b is a schematic drawing of the photovoltaic device of FIG. 4a after the annealing step.

Positive results have been obtained performing the step 18 on a CdTe absorber layer formed between two layers of CdS, to generate the alloy $CdS_xTe_{1-x}$, as shown in FIGS. 4a and 4b. The depth of the CdTe absorber layer may be about 3.3 μm. A first layer of CdS, also known as a semiconductor front contact buffer layer, formed between the CdTe layer and the glass substrate may have any depth desired. A second layer of CdS, also known as the semiconductor back contact buffer layer, formed on an opposite side of the CdTe may be from about 2 to about 100 nm. A pulsed diode green laser (about 543 nm) at about 100 kHz frequency and varying power levels is introduced on the CdS back contact buffer layer of a photovoltaic device to anneal the CdS back contact buffer layer and the CdTe absorber layer to form the alloy layer of $CdS_xTe_{1-x}$, as shown in FIG. 4b. The CdS back contact buffer layer may be substantially fully consumed during the step 18 and formation of the alloy layer of $CdS_xTe_{1-x}$ (see FIG. 4b), or a portion of the CdS back contact buffer layer may remain (not shown). By forming the $CdS_xTe_{1-x}$ alloy layer on the CdTe semiconductor absorber layer, recombination losses of photocarriers at the semiconductor absorber layer/back contact buffer layer interface are reduced, thereby reducing surface defects and improving $V_{oc}$ (and therefore operation) of the photovoltaic device.

Figure 5:
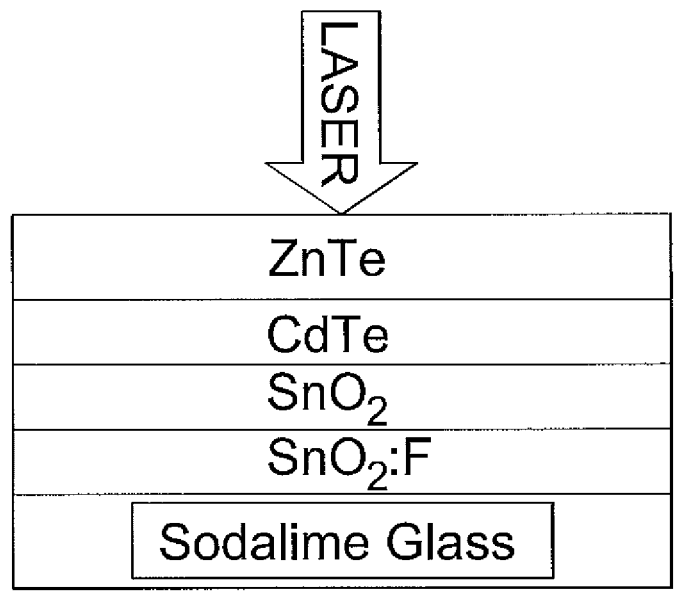
FIG. 5 is a schematic drawing of a photovoltaic device being formed pursuant to an annealing step of the method of FIG. 1 according to another embodiment of the invention.

In another embodiment of the invention shown in FIG. 5, the semiconductor back contact buffer layer is contacted by the laser or the flash lamp during the annealing step 18. The laser or the flash lamp anneals the back contact buffer layer to improve the crystallinity thereof. The back contact buffer layer is formed from ZnTe. By improving crystallinity of the ZnTe back contact buffer layer, the interface between the back contact buffer layer and the semiconductor absorber layer is improved, thereby improving the operation of the photovoltaic device. Using this method both efficiency and $V_{oc}$ of the photovoltaic device is improved, thereby improving an operation of the photovoltaic device. The wavelength of the energy from the laser or the flash lamp may be chosen so that the laser penetrates the back contact buffer layer to a desired depth so that the laser does not contact the semiconductor absorber layer, or so that the energy from the laser or the flash lamp is substantially fully absorbed by the back contact buffer layer. As the wavelength of the energy is shortened, absorption depth by the back contact buffer layer is deduced. Alternatively, if a flash lamp is used for the annealing step 18, the depth of penetration of the UV energy from the flash lamp may be controlled by controlling the duration and energy level of the flash lamp. By controlling a depth of penetration of the laser or the flash lamp, layers of the photovoltaic device under the back contact buffer layer are not contacted and an effect thereto caused by thermal energy is mitigated. It is understood that when the step 18 is conducted on the back contact buffer layer, the step 18 may be performed in a reactive gas environment, such as chlorine, to mitigate chlorine losses from the semiconductor absorber layer and to help passivate the back contact buffer layer surface.

As shown in FIG. 5, positive results have been obtained by depositing a back contact buffer layer as in step 16 at either room temperature or at elevated temperatures, and then conducting the annealing step 18 on the back contact buffer layer with a pulse UV laser or a UV flash lamp using energy having a wavelength above a band absorption edge of ZnTe, such as above 2.2 eV for ZnTe. This ensures that the energy from the pulse UV laser or the UV flash lamp will not penetrate the back contact buffer layer, thereby contacting the semiconductor absorber layer. If the step 18 is performed on a back contact buffer layer deposited at room temperatures, the back contact buffer layer is crystallized for the first time by the laser or the flash lamp. If the step 18 is performed on a back contact buffer layer deposited at elevated temperatures, the back contact buffer layer is crystallized during the high-temperature deposition and the annealing 18 is a further annealing step that further improves the crystallinity thereof.

While certain representative embodiments and details have been shown for purposes of illustrating the invention, it will be apparent to those skilled in the art that various changes may be made without departing from the scope of the disclosure, which is further described in the following appended claims.

What is claimed is:

1. A method of manufacturing a photovoltaic device comprising the steps of:
   providing a multilayer construct, the multilayer construct comprising a substrate having a thin-conductive oxide layer deposited thereon, a semiconductor absorber layer, and at least one semiconductor contact buffer layer; and annealing the semiconductor absorber layer or the semiconductor contact buffer layer with a laser or a flash lamp to form an alloy.

2. The method of claim 1, wherein the annealing forms an alloy in the semiconductor absorber layer.

3. The method of claim 1, wherein the annealing forms an alloy between the semiconductor absorber layer and the semiconductor contact buffer layer.

4. The method of claim 1, wherein the annealing is performed with a UV flash lamp or a pulse UV laser.

5. The method of claim 1, wherein the annealing is performed in an inert gas environment.

6. The method of claim 1, wherein the at least one semiconductor contact buffer layer comprises a semiconductor front contact buffer layer disposed between the substrate and the semiconductor absorber layer.

7. The method of claim 1, wherein the at least one semiconductor contact buffer layer comprises a semiconductor back contact buffer layer and the semiconductor absorber layer is disposed between the substrate and the semiconductor back contact buffer layer.

8. The method of claim 1, wherein the at least one semiconductor contact buffer layer comprises a semiconductor front contact buffer layer and a semiconductor back contact buffer layer, the semiconductor front contact buffer layer disposed between the substrate and the semiconductor absorber layer, and the semiconductor absorber layer disposed between the substrate and the semiconductor back contact buffer layer.

9. The method of claim 8, wherein the semiconductor absorber layer comprises CdTe, the semiconductor front contact buffer layer comprises CdS, and the semiconductor back contact buffer layer comprises CdS.

10. The method of claim 1, wherein the semiconductor absorber layer comprises CdTe and the at least one semiconductor contact buffer layer comprises CdS and the annealing forms an alloy layer of $CdS_xTe_{1-x}$ between the semiconductor absorber layer and the at least one semiconductor contact buffer layer.

11. The method of claim 10, wherein the at least one semiconductor contact buffer layer comprises a semiconductor front contact buffer layer disposed between the substrate and the semiconductor absorber layer, and the annealing forms the alloy layer of $CdS_xTe_{1-x}$ in place of substantially all of the semiconductor front contact buffer layer.

12. The method of claim 1, wherein the semiconductor absorber layer comprises CdTe and the at least one semiconductor contact buffer layer comprises ZnTe and the annealing forms an alloy layer of $Cd_{1-x}Zn_xTe$ between the semiconductor absorber layer and the at least one semiconductor contact buffer layer.

13. The method of claim 12, wherein the at least one semiconductor contact buffer layer comprises a semiconductor back contact buffer layer, the semiconductor absorber layer disposed between the substrate and the semiconductor back contact buffer layer, and the annealing forms the alloy layer of $Cd_{1-x}Zn_xTe$ in place of substantially all of the semiconductor back contact buffer layer.

14. The method of claim 1, wherein the semiconductor absorber layer comprises CdTe and the at least one semiconductor contact buffer layer comprises MnTe and the annealing forms an alloy layer of $Cd_{1-x}Mn_xTe$ between the semiconductor absorber layer and the at least one semiconductor contact buffer layer.

15. The method of claim 14, wherein the at least one semiconductor contact buffer layer comprises a semiconductor back contact buffer layer, the semiconductor absorber layer disposed between the substrate and the semiconductor back contact buffer layer, and the annealing forms the alloy layer of $Cd_{1-x}Mn_xTe$ in place of substantially all of the semiconductor back contact buffer layer.

16. The method of claim 1, wherein the semiconductor absorber layer comprises CdTe and the at least one semiconductor contact buffer layer comprises CdSe and the annealing forms an alloy layer of $CdSe_xTe_{1-x}$ between the semiconductor absorber layer and the at least one semiconductor contact buffer layer.

17. The method of claim 16, wherein the at least one semiconductor contact buffer layer comprises a semiconductor back contact buffer layer, the semiconductor absorber layer disposed between the substrate and the semiconductor back contact buffer layer, and the annealing forms the alloy layer of $CdSe_xTe_{1-x}$ in place of substantially all of the semiconductor back contact buffer layer.

18. The method of claim 1, wherein the semiconductor absorber layer comprises CdTe and the at least one semiconductor contact buffer layer comprises MgTe and the annealing forms an alloy layer of $Cd_{1-x}Mg_xTe$ between the semiconductor absorber layer and the at least one semiconductor contact buffer layer.

19. The method of claim 18, wherein the at least one semiconductor contact buffer layer comprises a semiconductor back contact buffer layer, the semiconductor absorber layer disposed between the substrate and the semiconductor back contact buffer layer, and the annealing forms the alloy layer of $Cd_{1-x}Mg_xTe$ in place of substantially all of the semiconductor back contact buffer layer.

20. The method of claim 1, wherein the semiconductor absorber layer comprises CdTe and the at least one semiconductor contact buffer layer comprises HgTe and the annealing forms an alloy layer of $Cd_{1-x}Hg_xTe$ between the semiconductor absorber layer and the at least one semiconductor contact buffer layer.

21. The method of claim 20, wherein the at least one semiconductor contact buffer layer comprises a semiconductor back contact buffer layer, the semiconductor absorber layer disposed between the substrate and the semiconductor back contact buffer layer, and the annealing forms the alloy layer of $Cd_{1-x}Hg_xTe$ in place of substantially all of the semiconductor back contact buffer layer.

22. The method of claim 1, wherein the semiconductor absorber layer comprises CdTe and CdS.

23. The method of claim 1, wherein the thin-conductive oxide layer comprises SnO2:F.

24. The method of claim 1, wherein the annealing includes introducing the laser or the flash lamp to the semiconductor absorber layer or the semiconductor contact buffer layer from a side opposite the substrate.

25. The method of claim 1, wherein the annealing includes controlling a depth of penetration of the energy of the laser or the flash lamp so that the energy does not contact other layers of the photovoltaic device.

26. A method of manufacturing a photovoltaic device comprising the steps of:
providing a multilayer construct, the multilayer construct comprising a substrate having a thin-conductive oxide layer deposited thereon, a semiconductor absorber layer including CdTe, and a semiconductor front contact buffer layer including ZnTe, MnTe, MgTe, HgTe, or CdSe, the semiconductor front contact buffer layer disposed between the substrate and the semiconductor absorber layer; and annealing the semiconductor absorber layer or the semiconductor contact buffer layer with a laser or a flash lamp to form an alloy including $Cd_{1-x}Zn_xTe$, $Cd_{1-x}Mn_xTe$, $Cd_{1-x}Mg_xTe$, $Cd_{1-x}Hg_xTe$, or $CdSe_xTe_{1-x}$.

27. A method of manufacturing a photovoltaic device comprising the steps of:

providing a multilayer construct, the multilayer construct comprising a substrate having a thin-conductive oxide layer deposited thereon, a semiconductor absorber layer including CdTe, and a semiconductor back contact buffer layer including ZnTe, MnTe, MgTe, HgTe, or CdSe, the semiconductor absorber layer disposed between the substrate and the semiconductor back contact buffer layer; and annealing the semiconductor absorber layer or the semiconductor contact buffer layer with a laser or a flash lamp to form an alloy including $Cd_{1-x}Zn_xTe$, $Cd_{1-x}Mn_xTe$, $Cd_{1-x}Mg_xTe$, $Cd_{1-x}Hg_xTe$, or $CdSe_xTe_{1-x}$.

\* \* \* \* \*